United States Patent
Munos et al.

(10) Patent No.: US 6,242,800 B1
(45) Date of Patent: *Jun. 5, 2001

(54) HEAT DISSIPATING DEVICE PACKAGE

(75) Inventors: Jorge Munos, Cyprus; Daniel M. Kinzer; Chuan Cheah, both of El Segundo, all of CA (US)

(73) Assignee: International Rectifier Corp., El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/815,814

(22) Filed: Mar. 12, 1997

(51) Int. Cl.[7] .............................. H01L 23/34; H01L 23/48
(52) U.S. Cl. ........................... 257/712; 257/724; 257/696
(58) Field of Search ......................... 257/693, 696, 257/697, 707, 712, 719, 724

(56) References Cited

U.S. PATENT DOCUMENTS

| | | | | |
|---|---|---|---|---|
| 4,891,686 | * | 1/1990 | Krausse, III | 257/706 |
| 5,521,429 | * | 5/1996 | Aono et al. | 257/676 |
| 5,521,431 | * | 5/1996 | Tahara | 257/676 |
| 5,530,284 | * | 6/1996 | Bailey | 257/670 |
| 5,583,372 | * | 12/1996 | King et al. | 257/676 |
| 5,625,226 | * | 4/1997 | Kinzer | 257/705 |
| 5,719,435 | * | 2/1998 | Davis et al. | 257/666 |
| 5,757,070 | * | 5/1998 | Fritz | 257/675 |

FOREIGN PATENT DOCUMENTS 3-286558 * 12/1991 (JP) ..................... 257/796

OTHER PUBLICATIONS

PTO 99–2220—Translation of Japanese Kokai Patent Application No. Hei 3–286558 Dec. 1991.*

* cited by examiner

Primary Examiner—Olik Chaudhuri
Assistant Examiner—Howard Weiss
(74) Attorney, Agent, or Firm—Ostrolenk, Faber, Gerb & Soffen, LLP

(57) ABSTRACT

A MOSFET die is mounted onto the bottom surface of a lead frame pad of a lead frame which has increased heat conducting capacity. The pad includes a plurality of at least four integral pins extending therefrom. The lead frame also includes isolated pins which are connected to the MOSFET source and drain using wire bonds. The lead frame and MOSFET are molded in a housing. The pins extend outside the molded housing for external connection, and the pins extending from the lead frame pad provide a path for heat removal from the MOSFET by a heat conduction path formed of the MOSFET drain electrode, the lead frame pad, their interconnection material and the pins.

6 Claims, 2 Drawing Sheets

HEAT DISSIPATING DEVICE PACKAGE

RELATED APPLICATIONS

This application is related to U.S. Pat. No. 5,625,226, issued Apr. 29, 1997 which is a continuation of Ser. No. 08/308,739 filed Sep. 19, 1994, now abandoned, both which are entitled "SURFACE MOUNT PACKAGE WITH IMPROVED HEAT TRANSFER" in the name of Daniel M. Kinzer, one of the present inventors, and assigned to the assignee of the present application.

FIELD OF THE INVENTION

This invention relates to semiconductor devices and, more specifically, to a novel device in which the die is fixed to the bottom surface of a lead frame within a package or housing and in which the lead frame serves to remove heat from the die in an improved manner.

BACKGROUND OF THE INVENTION

Numerous electrical circuits, for example, dc to dc converters, synchronous converters, and the like, require a number of semiconductor components, such as MOSFETs. These components typically generate heat which can increase the on-resistance or forward voltage drop of the MOSFET. If the MOSFET is located near other components, such as a microprocessor, the heat generated can also interfere with their operation.

Typically, the components are each housed in a surface mount package which normally consists of the semiconductor component die mounted with its back surface in contact with the surface of a lead frame and with its front surface including wires extending from connection pads to the lead extensions of the lead frame. The bottom of the lead frame is then typically located atop a heat-conducting slug whose bottom surface is to be connected to a flat surface which is to receive the surface mount package. The assembly, consisting of the die, lead frame and heat-conducting slug, is then encapsulated so that the flat bottom surface of the slug is exposed for surface connection and so that the lead frames extend out of the molded housing for external connection.

Surface mounted packages typically have a large plastic insulation portion located beneath the main pad area of the lead frame, namely between the lead frame and the board to which the device is mounted, that is unused. Also, the semiconductor device die is mounted to the top of the lead frame, which necessitates increasing the thickness of plastic at the top of the package to protect the die, thereby increasing the height of the package. It is also desirable to reduce the height of the surface mount package.

Principally, however, it is desired that heat be removed from the package as efficiently as possible.

SUMMARY OF THE INVENTION

In accordance with the present invention, a conductive lead frame in a semiconductor device includes a main pad area. At least two pins extend from one edge of the main pad area, and at least two pins extend from another edge of the main pad area. The at least four pins are integral with the main pad area to more efficiently remove heat from the main pad area. Additional pins are separated from the main pad area as well as from one another.

A semiconductor die has a surface that is disposed in contact with the main pad area of the lead frame and has one or more electrodes in electrical contact therewith. An opposing surface of the die also has one or more electrodes which are electrically connected to respective pins.

A molded housing encapsulates the lead frame in the semiconductor die. The pins extend outside the molded housing for external connection. The at least four pins that are integral with the main pad area thus serve to remove heat from the surface of the semiconductor die.

According to this aspect of the invention, the surface that is disposed to the main pad area may contact the bottom surface of the main pad area, and may electrically contact the in-line pins that are integral with opposing edges of the main pad area. The semiconductor die may include a MOSFET die that has source, drain and gate electrodes. The die surface that contacts the main pad area includes the drain electrode, and the opposing surface includes the source and gate electrodes which are connected to respective pins. The drain electrode may contact the bottom surface of the main pad area and may electrically contact the two pairs of in-line pins that are integral with opposing edges of the main pad area.

At least one electrode may be wire bonded to a respective pin by one or more bonding wires. The pins may be bent downwardly along the side edges of the housing to define a surface-mount device. The pins may be arranged in a line and may include an enlarged bonding pad area which are coplanar with one another and with the main pad area.

The package may include six pins. The pins may include a plated bond post.

The electrode of the surface that contacts the main pad area may be soldered to the main pad area or conductively bonded using a conductive epoxy. The molded housing may be a plastic transfer mold compound.

According to another aspect of the present invention, a surface mount package includes a conductive lead frame and a MOSFET die.

Other features and advantages of the present invention will become apparent from the following description of the invention which refers to the accompanying drawings.

DETAILED DESCRIPTION OF THE INVENTION

The present invention provides for a novel package in which the height of the package is reduced and in which heat generated by the semiconductor die is conducted by the die pad and the pins of the lead frame, thereby, removing the heat from the device.

Figure 1:
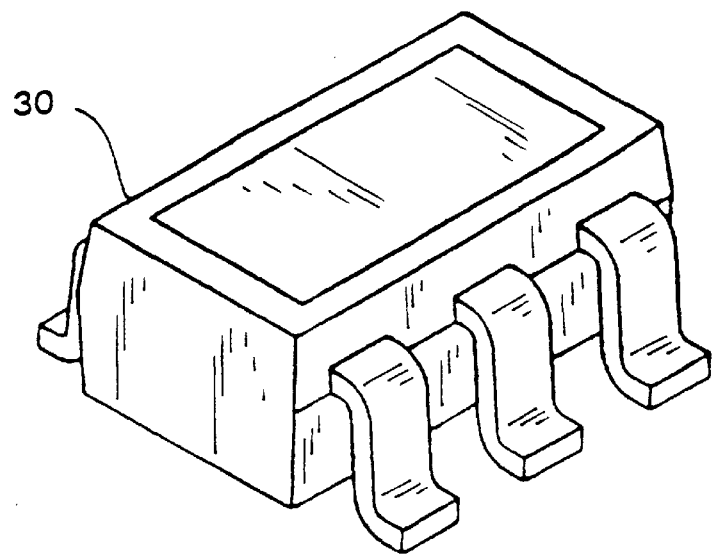
FIG. 1 is a diagram showing a perspective view of a device package according to an embodiment of the present invention.
Figure 3:
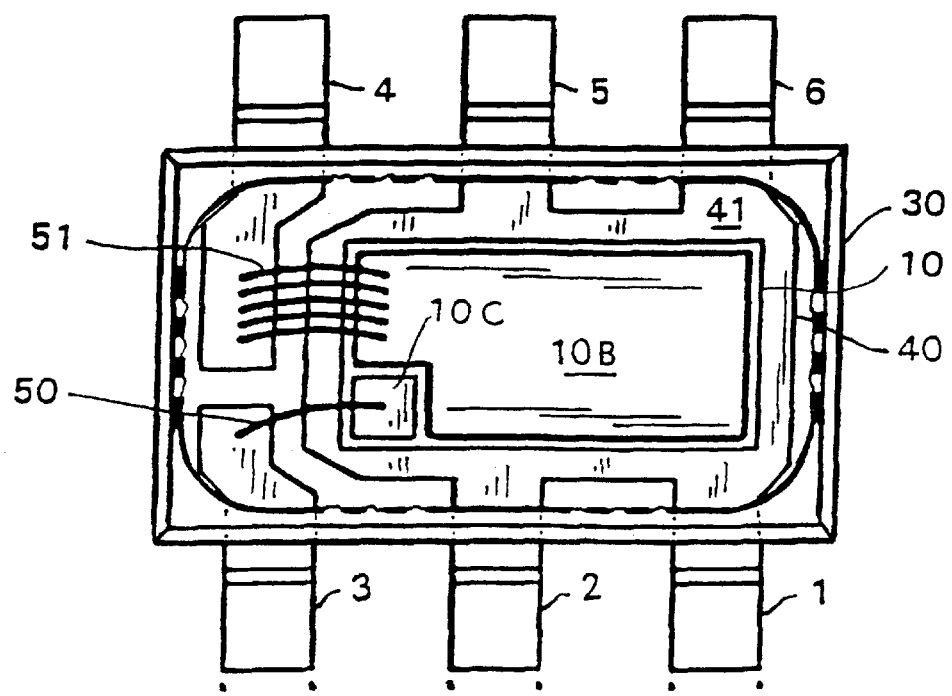
FIG. 3 is a diagram showing a cutaway bottom view of the package of FIG. 1.
Figure 4:
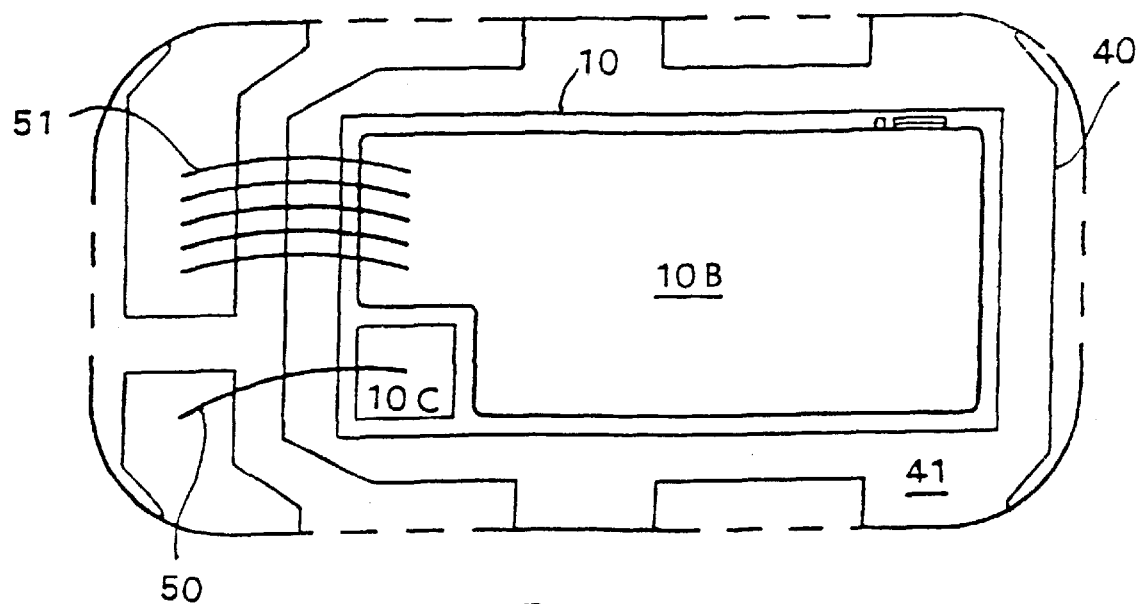
FIG. 4 shows an enlarged view of a portion of the device shown in FIG. 3.

Referring first to FIG. 1, there is shown a surface mount package with six in-line pins that extend from a plastic insulation housing 30 according to an embodiment of the present invention. As shown in FIGS. 3 and 4, a semiconductor die, such as a MOSFET die 10, is internally mounted on a conductive lead frame 40 from which the in-line pins 1 to 6 extend downward to enable external connection to the MOSFET.

Figure 2:
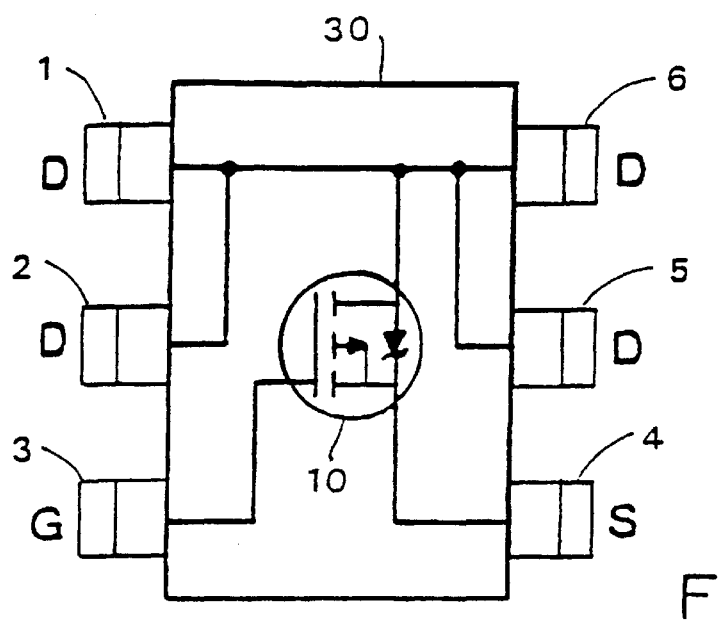
FIG. 2 shows a schematic top view of the package of FIG. 1.

FIG. 2 illustrates a schematic top view of the surface mount housing shown in FIG. 1. As shown in FIG. 2, the drain electrode of the MOSFET die 10 is electrically connected to two pairs of in-line pins 1–2 and 5–6 on opposing sides of the surface mount housing, and the gate and source electrodes located on the opposing surface of the MOSFET die 10 are connected to isolated pins 3 and 4, respectively. According to the invention, the novel structure of the lead frame 40 in which four pins are integral with the main pad area and the connection of the drain of the MOSFET die 10 to the four pins more efficiently remove heat from the MOSFET drain electrode.

FIGS. 3 and 4 illustrate a cutaway portion of the surface mount package showing a bottom view of the lead frame 40 and the MOSFET 10. The lead frame 40 includes an enlarged main pad body 41 having edges from which the two pairs of in-line pins 1–2 and 5–6 integrally extend. The two pairs of opposing integral pins provide multiple heat conduction paths which draw heat from the lead frame and to the surface on which the package is mounted.

The lead frame may have a conventional lead frame solder finish. The drain electrode of the MOSFET die 10 is electrically connected to the bottom surface of the main bond pad 41 using an electrically conductive epoxy die attach compound, and is thus electrically connected to pins 1–2 and 5–6. Alternatively, the cathode electrode is soldered to die pad 41.

Thus, the drain electrode, the connection between the drain electrode and the main die pad, the main die pad and the two pairs of integral in-line pins 1–2 and 5–6, in addition to providing an electrical conduction path, combine to provide a more efficient heat conduction path. The increased heat conduction efficiency results from the inclusion of multiple pines that are integral with the main pad area and which increase the rate of heat flow from the main pad area. Heat generated during the operation of MOSFET 10 is conducted away from the device by the main pad area and the pairs of integral in-line pins 1–2 and 5–6 and to the outside of the surface mount package.

It should also be noted that, alternatively, a conductive glass containing silver particles may be used to attach and electrically connect the drain electrode to the main die pad which is then sintered to provide a conductive path between the drain electrode and the main die pad.

The lead frame 40 also includes pins 3 and 4 and corresponding bond pad extensions which are formed within the molded housing 30. The pins 3 and 4 are initially integral with the lead frame body 40 and are connected to the lead frame body by extensions that, after molding, protrude outside the molded housing 30 and are severed to isolate pins 3 and 4 from the lead frame body. FIGS. 3 and 4 show pins 3 and 4 in their severed condition and isolated from one another and from the main die pad 41. Typically, pins 3 and 4 have enlarged bond pad areas which are coplanar with each other and with the main bond pad 41.

Figure 5:
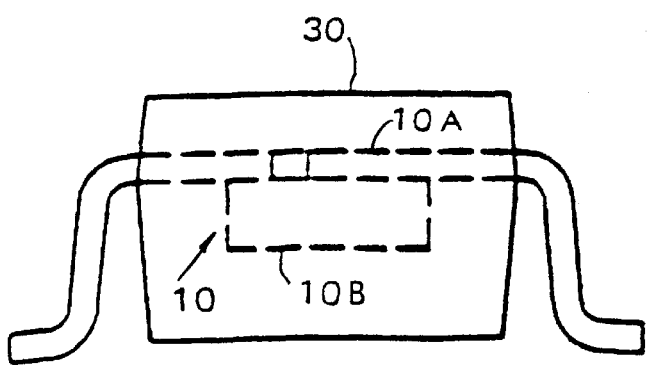
FIG. 5 is a diagram showing a cross-sectional view of the package of FIG. 1.

According to the present invention, the MOSFET die 10 is mounted upside-down in the lead frame 40 with the drain electrode 10A contacting the bottom surface of the main die pad 41, and the source and gate electrodes 10B and 10C facing downwards, as shown in FIG. 5. As a result, the MOSFET die is located within the thicker, and otherwise unused, portion of the surface mount package, thus reducing the height of the package, rather than mounting the MOSFET die to the top of the package which would further increase the height of the package. As a result of mounting the die to the bottom of the main frame pad, the package has a height of 0.90 to 1.30 mm (when the leads are included, the height ranges from 0.90 to 1.45 mm) as well as a length of 2.8 to 3.0 mm and a width of 1.50 to 1.75 mm (2.60 to 3.0 mm when the pin footprint is included).

It should also be noted that because the die is mounted to the bottom surface of the main pad area, heat generated during operation of the MOSFET 10 flows upward from the drain electrode to the lead frame 40. The upward flow of heat further increases the efficiency of heat removed from the MOSFET.

Turning back to FIGS. 3 and 4, prior to molding the housing 30, the gate electrode and source electrode of MOSFET 10 are bonded to the internal bonding extensions of pins 3 and 4, respectively, by gold bonding wires 50 and 51, respectively. Alternatively, aluminum bonding wires are used. The internal bonding extensions of the pins are typically silver or gold plated. The bonding wires are generally bonded to the electrodes of the die and to the internal bonding extensions of pins 3 and 4 using thermosonic ball bonding, as is known in the art, though other processes may be used.

After wire bonding, the molded housing 30 is formed around the die and lead frame using a conventional molding operation. Typically, the molding housing is a transfer mold compound, such as NITTO MP7400, though a ceramic housing, a hermetic housing or an injection molded metal housing may be used.

The resulting device may then be soldered down to a printed circuit board using conventional mass production soldering techniques.

The novel lead frame of the present invention results in a MOSFET device having greatly reduced on-resistance per silicon area and greatly increased current handling capacity. Typically, the on-resistance $R_{DS(on)}$ is 60% lower than the similar-sized conventional SOT-23 package and has an increased current handling capacity that is nearly 300% greater when compared to the SOT-23 package. As an example, for a $V_{DSS}$ value of −20V to −30V, $R_{DS(on)}$ typically has a value of 0.20 ohms.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:

a conductive lead frame having a main pad area, a first plurality of pins comprising at least four pins integral with said main pad area in which at least two of said pins extend from one edge of said main pad and at least another two of said pins extend symmetrically and in line with respect to said two pins from another edge of said pad that is opposite to said one edge, said integral pins being arranged to contact a heat removing substrate external to a molded housing, a second plurality of pins each separated from one another and from said main pad area;

a semiconductor die having opposing surfaces and including a MOSFET die having a source electrode, a drain electrode and a gate electrode, a first one of said opposing surfaces of said semiconductor die being disposed adjacent to said main pad area and including said drain electrode in electrical contact with the bottom surface of said main pad area and in electrical contact with said first plurality of pins, a second one of said opposing surfaces of said semiconductor die including said source electrode and said gate electrode each electrically connected to a respective one of said second plurality of pins;

said molded housing for encapsulating said lead frame and said semiconductor die;

said first and second pluralities of pins extending outside said molded housing for external connection such that heat generated by said MOSFET die is conducted from said die to said main pad area and is then conducted by each of said first plurality of pins to the substrate external of said molded housing, said first plurality of pins being sufficiently wide to efficiently remove heat from said semiconductor die; and said first and second plurality of pins being downwardly bent along the side edges of said housing and terminating on a common plane to define a surface mount device.

2. The device of claim 1 wherein said molded housing has a height of substantially in the range of 0.9 to 1.45 mm.

3. The device of claim 1 wherein each of said second plurality of pins has an enlarged bonding pad area which are coplanar with one another and with said main pad area.

4. The device of claim 1 wherein said first and second plurality of pins comprises a total of six pins.

5. The device of claim 1 wherein each of said first and second plurality of pins includes a plated bond post.

6. The device of claim 1 wherein said source and gate electrodes are each wire bonded to a respective one of said second plurality of pins using at least one bonding wire.

* * * * *

UNITED STATES PATENT AND TRADEMARK OFFICE
CERTIFICATE OF CORRECTION

PATENT NO. : 6,242,800 B1
DATED : June 5, 2001
INVENTOR(S) : Jorge Munoz, Daniel M. Kinzer and Chuan Cheah It is certified that error appears in the above-identified patent and that said Letters Patent is hereby corrected as shown below:

<u>Title page,</u>
Please correct the name of the first Inventor as follows:
Item [75] Inventors, change "Munos" to -- Munoz --.

Signed and Sealed this

Fifteenth Day of January, 2002

Attest:

Attesting Officer

JAMES E. ROGAN
*Director of the United States Patent and Trademark Office*